United States Patent [19]

Adams

[11] 4,006,409
[45] Feb. 1, 1977

[54] ELECTRICAL GROUND FAULT DETECTING DEVICE

[76] Inventor: Bertram C. Adams, 2295 NW. 14th St., Miami, Fla. 33125

[22] Filed: Aug. 23, 1974

[21] Appl. No.: 499,827

Related U.S. Application Data

[63] Continuation-in-part of Ser. No. 389,451, Aug. 20, 1973, abandoned.

[52] U.S. Cl. .............................. 324/51; 324/72.5; 324/133
[51] Int. Cl.² ................. G01R 31/02; G01R 19/16
[58] Field of Search ............. 324/51, 53, 72, 72.5, 324/133, 149

[56] References Cited

UNITED STATES PATENTS

| | | | |
|---|---|---|---|
| 2,109,189 | 2/1938 | Bly | 324/52 X |
| 2,156,319 | 5/1939 | Steele | 324/53 |
| 2,164,148 | 6/1939 | Swanson | 324/53 X |
| 2,942,189 | 6/1960 | Shea et al. | 324/133 |
| 3,009,099 | 11/1961 | Müller | 324/149 X |
| 3,183,439 | 5/1965 | Rosinek | 324/133 X |
| 3,204,183 | 8/1965 | Hasenzahl | 324/133 |
| 3,437,928 | 4/1969 | Baker et al. | 324/133 |
| 3,774,110 | 11/1973 | Roveti | 324/72 X |
| 3,828,256 | 8/1974 | Liu | 324/133 |
| 3,863,149 | 1/1975 | Johnson | 324/72.5 |
| 3,878,459 | 4/1975 | Hanna | 324/133 |
| 3,919,631 | 11/1975 | Brown | 324/133 X |

FOREIGN PATENTS OR APPLICATIONS

| | | | |
|---|---|---|---|
| 474,305 | 6/1951 | Canada | 324/53 |

OTHER PUBLICATIONS

Plummer, J. W., Probe for Quickly Checking '0' and "1" States in a Logic Circuit, *Electronic Engineering*, p. 614, Nov. 1968.

*Primary Examiner*—Gerard R. Strecker
*Attorney, Agent, or Firm*—Ernest H. Schmidt

[57] ABSTRACT

A self-contained, hand-held device for detecting ground fault to the housing or casing of AC energized electrical equipment, appliances, tools or building wiring is described. A metal probe at one end of the device held against the conductive housing or casing of the equipment to be tested for ground fault applies, under ground fault conditions, a capacitively induced signal voltage to the conductive equipment housing in contact with the input circuit of the device operative to energize an output circuit including an indicator presenting a visual indication of ground fault.

4 Claims, 6 Drawing Figures

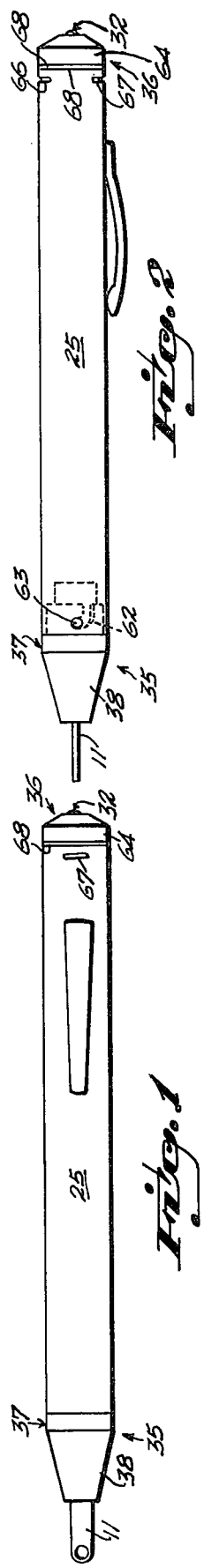
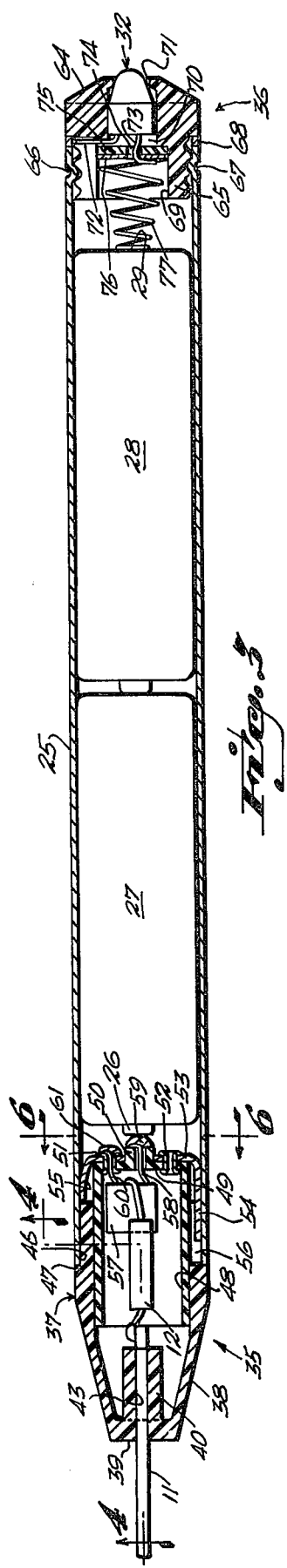
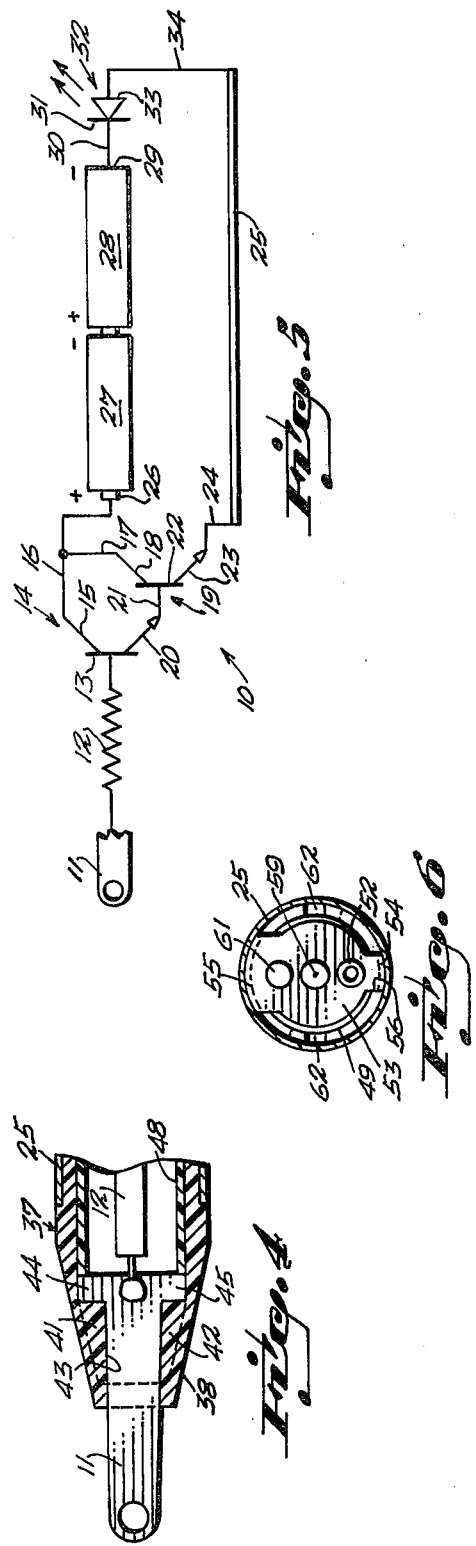

ELECTRICAL GROUND FAULT DETECTING DEVICE

This invention is a continuation in part of application Ser. No. 389,451, filed Aug. 20, 1973, now abandoned, and is directed particularly to the provision of a novel and improved hand-held detecting device which, when applied with one-point contact to the supposedly electrically grounded metal casing or housing of the electrical equipment to be tested will immediately indicate whether or not such casing or housing is faulty, that is, either ungrounded and/or at an alternating current electrical potential above ground caused, for example, by a short circuit existing between the 60 cycle alternating current electrical supply circuit and the casing or housing.

Electrical ground faults in AC-powered equipment which render the housing or casing of such equipment either ungrounded or electrically "hot" are extremely hazardous because of the danger of electrocution upon handling the equipment. This is especially true of electrically-powered hand tools, since the user of such hand tools not infrequently stands on well-grounded surfaces such as damp soil, wet floors and the like, which provide a low resistance current return path through the operator from hand to ground. Hand tools, moreover, because of the hard usage they undergo, are particularly subject to electrical wiring and insulation breakdown and resultant ground fault. It is, accordingly, the principal object of this invention to provide a novel and improved electrical ground fault detecting device that can safely and rapidly detect ground faults involving either open ground or an electrically hot equipment or tool housing or casing prior to handling to minimize the possibility of electrical shock.

Another subject of the invention is to provide an electrical ground fault detecting device of the character described which is fully self-contained, which can easily be held in one hand, and which, by application of a metallic probe at one end of the tool to any point of the casing or housing of the equipment to be tested, will safely and immediately indicate whether or not the housing or casing is at ground potential for safe operation.

A more particular object of the invention is to provide an electrical ground fault detecting device of the character described that relies on capacitive coupling between live wiring inside of the equipment housing or casing through the detecting device and through the body of the person using the device to provide the above-ground signal voltage controlling its operation.

Yet another object of the invention is to provide an electrical ground fault detecting device of the character described which will be simple in construction, light in weight, compact, inexpensive to manufacture, easy to operate, dependable and safe in operation and long wearing in use.

Other objects, features and advantages of the invention will be apparent from the following description when read with reference to the accompanying drawing.

In the drawings, wherein like reference numerals denote corresponding parts throughout the several views:

FIG. 1 is a side view of an electrical ground fault detecting device embodying the invention, as observed directly facing the pocket clip thereof;

FIG. 2 is a view similar to that of FIG. 1 but showing the device rotated through 90 circular degrees so that the pocket clip faces downward, and further illustrates internal constructional details;

FIG. 3 is a side view of the device as illustrated in FIG. 2, on an enlarged scale and in longitudinal cross-section to reveal internal constructional details;

FIG. 4 is a fragmentary view, in longitudinal cross-section, taken along the line 4—4 of FIG. 3, looking in the direction of the arrows;

FIG. 5 is an electrical schematic drawing of the electrical ground fault detecting device illustrated in FIGS. 1 through 4; and FIG. 6 is a transverse cross-sectional view taken along the line 6—6 of FIG. 3 in the direction of the arrows.

Referring now in detail to the drawing, reference numeral 10 in FIG. 5 designates, generally, the electrical circuitry of a preferred form of electrical ground fault detecting device embodying the invention, the same comprising a metallic probe 11 connected through a one megohm resistor 12 to the base 13 of an input npn transistor 14. The probe 11, instead of being a metal, could alternatively be fabricated of a somewhat resilient conductive synthetic plastic material. The collector 15 of input transistor 14 connected through conductors 16 and 17 to the collector 18 of output transistor 19, and emitter 20 of said input transistor is connected through conductor 21 to the base 22 of said output transistor 19. The emitter 23 of output transistor 19 is returned to circuit ground comprising tubular metallic housing 25 of the device through conductor 24. The collector 15 of input transistor 14 also connects to the positive terminal 26 of a three volt DC source of supply constituted by a pair of ordinary penlight dry cells 27, 28 connected in series. The negative terminal 29 of the dry cell battery connects through conductor 30 to the cathode 31 of a light-emitting diode 32. The anode 33 of the light-emitting diode 32 is connected to housing ground 25 through conductor 34.

As best illustrated in FIG. 3, the above described circuitry of FIG. 5 is housed in a casing comprising the metallic tubular housing member 25, probe assembly 35 removably affixed to one end of said metallic housing, and a light-emitting diode cap assembly 36 removably affixed to the other end of said metallic housing member.

The probe assembly 35 comprises a tubular member 37 having a frusto-conical front end portion 38 enclosed at its outer end by a front wall portion 39. The tubular member 37 is non electrically conductive, and is preferably fabricated by injection molding of a tough synthetic plastic material. The interior of the frusto-conical front end portion 38 of the tubular member 37 is integrally formed with a cylindrical axial boss 40 (see FIG. 3) having diametrically opposed wing portions 41, 42 (see FIG. 4) merging with inner wall portions of said frusto-conical portion. The frusto-conical front end portion 38 is further formed with an axial rectangular slot 43 for the snug though passage of the probe 11. The inner end of the probe 11 is provided with opposed wing portions 44, 45 which seat down against outer ends portions of the wing portions 41, and 42, and are clamped thereagainst to retain said probe in assembled relation in the manner hereinbelow more particularly described.

The tubular member 37 of the probe assembly 35, at its end opposite the frusto-conical portion 38, is formed with a slightly reduced-diameter outer wall portion 46 defining an annular shoulder 47. As best illustrated in FIG. 3 the reduced-diameter portion 46 is of such size as to receive in interfitting relation the front end of the tubular housing member 25, to be retained in place in seated relation against the shoulder 47 by means hereinbelow more particularly described.

The probe assembly 35 further comprises a tubular sleeve member 48 slidingly received within the tubular member 37, the inner end of which, when fully inserted, is adapted to seat against and clamp the wing portions 44 and 45 of the metallic probe 11 in seated position as described above. The tubular sleeve member 48 is also preferably fabricated of a tough synthetic plastic, electrically-insulating material, and upon fabrication of the probe assembly 35 will be secured in place by means of a small quantity of a suitable cement applied between the interfitting peripheral surfaces.

The outer end of the tubular sleeve member 48 is integrally formed with an end wall portion 49 having a short, outwardly-extending cylindrical boss 50. Secured against the outer surface of the end wall portion 49 as by diametrically opposed rivets 51, 52 is a sheet metal contactor plate 53, said contactor plate having a central opening for the through passage of the boss 50. The metal contactor plate 53 is integrally formed at one side with an elongated lug contact portion 54 overlying one side of the sleeve member 48 and a relatively short and wide contact portion 55 overlying the opposite side of sleeve member. As illustrated in FIG. 3, the outer periphery of the tubular member 37 is provided with a slot 56 for the reception of the elongated contactor portion 54, whereas the contact portion 55 falls just short of the inner end of tubular member 37.

As best illustrated in FIG. 3, the above described circuitry of FIG. 5 is housed in a casing comprising the metallic tubular housing member 25, probe assembly 35 removably affixed to one end of said metallic housing, and a light-emitting diode cap assembly 36 removably affixed to the other end of said metallic housing member.

Arranged within the sleeve member 48 is the resistor 12 and dual transistor unit 57 comprising input and output transistors 14 and 19, respectively, of the electrical circuitry of the device illustrated schematically in FIG. 5. As illustrated in FIG. 3, one terminal conductor lead of the one megohm resistor 12 is soldered to the inner end of the metallic probe 11, and the other terminal connector lead of said resistor connects with one of the leads of the dual transistor unit which extends from the base of the input transistor 14 (as illustrated in FIG. 5). Connector lead 58 of the dual transistor unit 57, which corresponds with conductor 16 of the schematic diagram of FIG. 5, extends through a central opening in the boss 50 to terminate in a soldered contactor projection 59. The remaining connector lead 60 of the dual transistor unit 57 extends through the rivet 51, to which it is soldered, as indicated at 61, for electrical connection with the metal contactor plate 53, said connection corresponding to the connector lead 24 of FIG. 5. As illustrated in FIG. 3, upon assembly of the probe assembly 35 to the tubular metallic housing 25, electrical interconnection is effected between the dual transistor unit lead 60 and said metallic housing.

As illustrated in FIG. 2, the inner end of the probe assembly tubular member 37 is provided with opposed bayonet slots 62 (only one illustrated in FIG. 2) within which diametrically-opposed, inwardly extending projections 63 formed near the end of the tubular housing member 25 project for interlocking securement upon pushing inwardly and twisting of the probe assembly 35.

The light-emitting diode cap assembly 36 comprises a non-electrically conductive screw cap member 64 which, preferably, will also be integrally molded of a tough synthetic plastic material, said screw cap member being formed with a slightly reduced-diameter, externally-threaded portion 65 threadingly received within the outer end of the tubular metallic housing 25 (see FIG. 3). Marginal outer end portions of the tubular metallic housing 25 are stamped or otherwise formed with inwardly-projecting, diametrically-opposed threaded sections 66, 67 for threadingly engaging the screw cap member 64. Seated against the annular shoulder at the inner end of the externally-threaded portion 65 is a metallic ring 68 adapted to be clamped in place against the outer end of the tubular metallic housing 25 upon assembly of the light-emitting diode cap assembly 36 thereto. The screw-threaded end of the screw cap member 64 is formed with a first axial bore 69 which extends into a reduced-diameter, coaxial bore 70 which, in turn, merges, near the outer end of said cap member, with a short, through opening 71 of somewhat further reduced diameter. Fitted within the chamber defined by the central bore 70 and projecting slightly outwardly of the outer end of through bore 71 is the light-emitting diode 32. The anode terminal lead 72 of the light emitting diode 32 is soldered or otherwise electrically connected with an inner surface portion of the metallic ring 68. The cathode lead 73 extends through the central opening 74 of an insulating washer 75 seated against the annular shoulder defined by the juncture between the inner and cental bores 69, 70, respectively, to make electrical contact with a thin metallic washer 76 seated against the outside of said insulating washer. A tapered helical compression spring 77 has its larger diameter and frictionally received and retained within the bore 69 in seating engagement with respect to the metallic washer 76 so as to make electrical contact with the light-emitting diode cathode lead 73. As illustrated in FIG. 3, the tubular metallic housing 25 is of such length as to receive therein the penlight dry cells 27 and 28 in such a manner that the positive terminal 26 of the innermost cell will be urged in abutting electrical contact with the contactor projection 59 for interconnection with the hereinabove described circuitry of the device, while the contactor spring resiliently abuts the negative terminal end of the outer penlight cell 28, which is in series electrical contact with said inner cell. The battery source of supply is thus applied between the cathode terminal of the light-emitting diode 32 and the connector lead 58 of the dual transistor unit 57, which corresponds with conductor 16 of the schematic diagram of FIG. 5. The anode lead 72 of the light-emitting diode 32 is returned, through conductor ring 68, metallic housing 25, and contact portions 54 and 55 to connector lead 60 of the dual transistor unit 57, said connection corresponding to the connector lead 24 of FIG. 5.

In operation, the tool will be held by the tubular housing member 25 without touching the probe 11, and said probe will be applied to the metallic housing or casing of the equipment under test. Since the input transistor 14 will normally be at cut-off potential, no output voltage is applied to the light-emitting diode 32, so that it remains extinguished. If the equipment being tested in this manner is properly grounded, there will be no rise in potential at the base 13 of input transistor 14, so that it remains at cut-off potential. The light-emitting diode 32 thus remains extinguished, indicating the grounded or safe operating condition of the equipment housing or metallic casing under test. If, however, the equipment housing or casing is ungrounded, "floating" or, even more serious, shorted to AC supply potential or hot, an alternating potential sufficient to saturate the input transistor 14 will be applied at its base 13, thereby providing a positive output bias voltage to the base of output transistor 19, causing it also to saturate and thereby furnish an output current sufficient to turn on or light the light-emitting diode 32. In this connection, it is to be noted that the above-described transistor circuitry wherein the two transistors 14 and 19 are directly coupled, is well known as being connected in cascade. This circuit is not only very simple, but also provides a very high current gain, and is therefore well suited to drive the light-emitting diode 32.

Assuming first that the equipment under test has a fault of an ungrounded housing or casing, such ungrounded casing will have a capacitively induced alternating potential or charge by virtue of its proximity to the electrically charged elements of the enclosed circuitry. The equipment housing or casing potential or charge thus induced will, through the capacitive coupling afforded between the body of the person making the test and ground, and the capacitive coupling between the equipment housing or casing and electrically charged elements of the enclosed circuitry, results in the superimposition upon the base 13 of input transistor 14 of an alternating current potential sufficient, during positive half cycles, to effect conduction in input transistor 14 and the output transistor 19 and thus, as described above, illumination during alternate half cycles of the AC potential, of the light-emitting diode 32. Since the alternating current potentials to be measured will ordinarily be at the frequency of 60 cycles per second, such rapid fluctuation in the illumination of the light-emitting diode 32 will not be noticeable to the eye and will appear as constant illumination upon detection of a fault.

If the fault under test happens to be an AC potential short circuit to the equipment housing or casing, capacitive coupling providing the increase of signal voltage or potential detected by the light-emitting diode 32 will be directly from the body of the person using the detector to the surrounding ground.

In addition to the uses of the electrical ground fault detecting device as described above, it can also serve as an electrician's or household tool for detecting live household wiring simply by touching the probe 11 to the wire or electrically conductive terminal, for example, to be tested. For household use, the probe 11 will preferably be made of such size or shape as to be insertable within the contactor openings of an ordinary electrical outlet or receptacle so that a determination can readily be made as to the grounded or electrically hot condition of the receptacle terminal contactor elements.

While I have illustrated and described herein only one form in which the invention can conveniently be embodied in practice, this embodiment is presented by way of example only and not in a limiting sense. It is to be understood that PNP and or field effect transistors could replace the ones shown with circuit modifications. The invention, in brief, comprises all the embodiments and modifications coming within the scope and spirit of the following claims.

What I claim as new and desire to secure by Letters Patent is:

1. An electrical ground fault detecting device comprising, in combination, an electrical signal amplifier having an input circuit and an output circuit and battery means for energizing said signal amplifier in said output circuit and comprising a high potential circuit path and a battery means return circuit, said input circuit comprising a probe member adapted for electrical abutment connection with a metallic casing or housing for detecting a 60 cycle alternating current electrical potential thereof with respect to earth ground, said output circuit comprising a signal indicator means responsive to a detected 50 to 60 cycle alternating current potential, an elongated, tubular, electrically-conductive housing member, said housing member comprising support means for said electrical signal amplifier and serving as a handle for the manual application of said probe into abutting contact with the metallic casing or housing being tested for ground fault, said input circuit being responsive to the capacitive coupling between the body of the person holding the device and earth ground to supply a detected alternating current potential of sufficient amplitude for operation of the device, said indicating means being unresponsive to direct current leakage from said battery return circuit including the body of a person holding the device in any external resistive return circuit to said probe, said input circuit comprising a current limiting resistor in series with said probe member, said probe member projecting outwardly of one end of said housing member, said battery means comprising a pair of tubular dry cells coaxially disposed in series connection within said housing member, said signal indicator means comprising a light emitting diode positioned at the other end of said housing member, said input circuit comprising input and output transistors in cascade, a probe assembly, said probe assembly comprising a tubular, non-electrically conductive support member, means securing one end of said tubular support member within one end of said tubular metallic housing member, said probe member extending outwardly of the other end of said tubular support member, said current limiting resistor and said input and output transistors being supported by and within said tubular support member, and abutment contact means electrically interconnecting said output circuit with said metallic housing member and with one terminal contact of said dry cell battery, a non-electrically conductive screw-cap member, means threadingly receiving said screw-cap member within the other end of said tubular housing member, said light emitting diode being supported centrally within and being visible from the outer end of said screw-cap member, and means for establishing abutting electrical contact of one electrical terminal of said light emitting diode with said tubular housing member, and the other electrical terminal of said light emitting diode with the remaining terminal contact of said dry cell battery upon inter-threadingly engaging said screw-cap member with respect to said other end of said tubular housing member.

2. An electrical ground fault detecting device as defined in claim 1, wherein said means securing one end of said tubular support member within one end of said tubular metallic housing member comprises opposed bayonet slots formed in said tubular support member and opposed, inwardly-extending projections formed within said one end of said tubular metallic housing member near said one end thereof for interlocking securement upon pushing inwardly and twisting of said probe assembly with respect to said tubular housing member.

3. An electrical ground fault detecting device as defined in claim 1, wherein said electrical contact establishing means comprises an annular shoulder formed about said screw-cap member, and an electrical conductor ring seated against said shoulder and adapted to abuttingly contact the outer edge of said other end of said tubular housing member upon said interthreading engagement, said one of said light emitting diode terminals being electrically connected with said conductor ring.

4. An electrical ground fault detecting device as defined in claim 3, wherein said electrical contact establishing means further comprises a helical compression spring coaxially disposed within said tubular housing member and extending outwardly of the inner end of said screw-cap member, the other of said light emitting diode terminals being electrically connected with the inner end of said helical compression spring, and the outer end of said helical compression spring being adapted to abuttingly contact said remaining terminal contact of said dry cell battery upon interthreadingly engaging said screw-cap member with respect to the other end of said tubular housing member.

* * * * *